United States Patent
Baptist et al.

(10) Patent No.: US 9,760,440 B2
(45) Date of Patent: Sep. 12, 2017

(54) SITE-BASED NAMESPACE ALLOCATION

(71) Applicant: International Business Machines Corporation, Armonk, NY (US)

(72) Inventors: Andrew D. Baptist, Mt. Pleasant, WI (US); Bart R. Cilfone, Chicago, IL (US); Greg R. Dhuse, Chicago, IL (US); Wesley B. Leggette, Chicago, IL (US); Jason K. Resch, Chicago, IL (US); Patrick A. Tamborski, Chicago, IL (US); Ilya Volvovski, Chicago, IL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 4 days.

(21) Appl. No.: 15/213,811

(22) Filed: Jul. 19, 2016

(65) Prior Publication Data

US 2016/0328295 A1    Nov. 10, 2016

Related U.S. Application Data

(63) Continuation-in-part of application No. 14/447,909, filed on Jul. 31, 2014, which is a continuation of
(Continued)

(51) Int. Cl.
*G06F 12/00* (2006.01)
*G06F 11/10* (2006.01)
(Continued)

(52) U.S. Cl.
CPC .......... *G06F 11/1076* (2013.01); *G06F 3/065* (2013.01); *G06F 3/067* (2013.01);
(Continued)

(58) Field of Classification Search
None
See application file for complete search history.

(56) References Cited

U.S. PATENT DOCUMENTS

| | | | |
|---|---|---|---|
| 4,092,732 A | 5/1978 | Ouchi | |
| 5,454,101 A | 9/1995 | Mackay et al. | |

(Continued)

OTHER PUBLICATIONS

Shamir; How to Share a Secret; Communications of the ACM; vol. 22, No. 11; Nov. 1979; pp. 612-613.

(Continued)

*Primary Examiner* — Baboucarr Faal
(74) *Attorney, Agent, or Firm* — Garlick & Markison; Timothy W. Markison; Harry S. Tyson, Jr.

(57) ABSTRACT

A distributed storage network (DSN) can include a DSN memory and a distributed storage (DS) managing unit in communication with the DSN memory. The DSN memory includes DS units physically located at different sites. The DS units store encoded data slices associated with a storage vault having a number of pillars and a read threshold. The number of pillars correspond to a number of encoded data slices generated from a particular segment of data, and the read threshold corresponds to subset of those encoded data slices required to reconstruct the particular segment of data. The DS managing unit assigns storage of particular encoded data slices to particular DS units based, at least in part, on a pillar associated with the encoded data slices and on the physical locations, e.g. the sites, at which the DS units are located.

20 Claims, 6 Drawing Sheets

| DS unit assignment table 102 | | | |
|---|---|---|---|
| configuration 104 | | assignments 106 | |
| site ID 108 | DS unit ID 110 | pillar ID 112 | DSN address range 114 |
| 1 | 1 | 0 - A | 1st 16th |
| 1 | 2 | 0 - B | 2nd 16th |
| 1 | 3 | 1 - A | 3rd 16th |
| 1 | 4 | 1 - B | 4th 16th |
| 2 | 5 | 2 - A | 5th 16th |
| 2 | 6 | 2 - B | 6th 16th |
| 2 | 7 | 3 - A | 7th 16th |
| 2 | 8 | 3 - B | 8th 16th |
| 3 | 9 | 4 - A | 9th 16th |
| 3 | 10 | 4 - B | 10th 16th |
| 3 | 11 | 5 - A | 11th 16th |
| 3 | 12 | 5 - B | 12th 16th |
| 4 | 13 | 6 - A | 13th 16th |
| 4 | 14 | 6 - B | 14th 16th |
| 4 | 15 | 7 - A | 15th 16th |
| 4 | 16 | 7 - B | 16th 16th |

Related U.S. Application Data application No. 12/943,826, filed on Nov. 10, 2010, now Pat. No. 8,954,667.

(60) Provisional application No. 61/299,228, filed on Jan. 28, 2010.

(51) Int. Cl.
*G06F 3/06* (2006.01)
*H04L 29/08* (2006.01)
*H03M 13/15* (2006.01)

(52) U.S. Cl.
CPC .......... *G06F 3/0614* (2013.01); *G06F 3/0617* (2013.01); *G06F 3/0619* (2013.01); *G06F 3/0644* (2013.01); *G06F 3/0647* (2013.01); *G06F 11/1092* (2013.01); *H04L 67/1097* (2013.01); *G06F 2211/1028* (2013.01); *H03M 13/1515* (2013.01)

(56) References Cited

U.S. PATENT DOCUMENTS

| | | | |
|---|---|---|---|
| 5,485,474 | A | 1/1996 | Rabin |
| 5,774,643 | A | 6/1998 | Lubbers et al. |
| 5,802,364 | A | 9/1998 | Senator et al. |
| 5,809,285 | A | 9/1998 | Hilland |
| 5,890,156 | A | 3/1999 | Rekieta et al. |
| 5,987,622 | A | 11/1999 | Lo Verso et al. |
| 5,991,414 | A | 11/1999 | Garay et al. |
| 6,012,159 | A | 1/2000 | Fischer et al. |
| 6,058,454 | A | 5/2000 | Gerlach et al. |
| 6,128,277 | A | 10/2000 | Bruck et al. |
| 6,175,571 | B1 | 1/2001 | Haddock et al. |
| 6,192,472 | B1 | 2/2001 | Garay et al. |
| 6,256,688 | B1 | 7/2001 | Suetaka et al. |
| 6,272,658 | B1 | 8/2001 | Steele et al. |
| 6,301,604 | B1 | 10/2001 | Nojima |
| 6,356,949 | B1 | 3/2002 | Katsandres et al. |
| 6,366,995 | B1 | 4/2002 | Vilkov et al. |
| 6,374,336 | B1 | 4/2002 | Peters et al. |
| 6,415,373 | B1 | 7/2002 | Peters et al. |
| 6,418,539 | B1 | 7/2002 | Walker |
| 6,449,688 | B1 | 9/2002 | Peters et al. |
| 6,567,948 | B2 | 5/2003 | Steele et al. |
| 6,571,282 | B1 | 5/2003 | Bowman-Amuah |
| 6,609,223 | B1 | 8/2003 | Wolfgang |
| 6,718,361 | B1 | 4/2004 | Basani et al. |
| 6,760,808 | B2 | 7/2004 | Peters et al. |
| 6,785,768 | B2 | 8/2004 | Peters et al. |
| 6,785,783 | B2 | 8/2004 | Buckland |
| 6,826,711 | B2 | 11/2004 | Moulton et al. |
| 6,879,596 | B1 | 4/2005 | Dooply |
| 7,003,688 | B1 | 2/2006 | Pittelkow et al. |
| 7,024,451 | B2 | 4/2006 | Jorgenson |
| 7,024,609 | B2 | 4/2006 | Wolfgang et al. |
| 7,080,101 | B1 | 7/2006 | Watson et al. |
| 7,103,824 | B2 | 9/2006 | Halford |
| 7,103,915 | B2 | 9/2006 | Redlich et al. |
| 7,111,115 | B2 | 9/2006 | Peters et al. |
| 7,140,044 | B2 | 11/2006 | Redlich et al. |
| 7,146,644 | B2 | 12/2006 | Redlich et al. |
| 7,171,493 | B2 | 1/2007 | Shu et al. |
| 7,203,871 | B2 * | 4/2007 | Turner ............... G06F 11/1076 711/148 |
| 7,222,133 | B1 | 5/2007 | Raipurkar et al. |
| 7,240,236 | B2 | 7/2007 | Cutts et al. |
| 7,272,613 | B2 | 9/2007 | Sim et al. |
| 7,636,724 | B2 | 12/2009 | de la Torre et al. |
| 2002/0062422 | A1 | 5/2002 | Butterworth et al. |
| 2002/0166079 | A1 | 11/2002 | Ulrich et al. |
| 2003/0018927 | A1 | 1/2003 | Gadir et al. |
| 2003/0037261 | A1 | 2/2003 | Meffert et al. |
| 2003/0065617 | A1 | 4/2003 | Watkins et al. |
| 2003/0084020 | A1 | 5/2003 | Shu |
| 2004/0024963 | A1 | 2/2004 | Talagala et al. |
| 2004/0122917 | A1 | 6/2004 | Menon et al. |
| 2004/0215998 | A1 | 10/2004 | Buxton et al. |
| 2004/0228493 | A1 | 11/2004 | Ma et al. |
| 2005/0100022 | A1 | 5/2005 | Ramprashad |
| 2005/0114594 | A1 | 5/2005 | Corbett et al. |
| 2005/0125593 | A1 | 6/2005 | Karpoff et al. |
| 2005/0131993 | A1 | 6/2005 | Fatula, Jr. |
| 2005/0132070 | A1 | 6/2005 | Redlich et al. |
| 2005/0144382 | A1 | 6/2005 | Schmisseur |
| 2005/0229069 | A1 | 10/2005 | Hassner |
| 2006/0047907 | A1 | 3/2006 | Shiga et al. |
| 2006/0136448 | A1 | 6/2006 | Cialini et al. |
| 2006/0156059 | A1 | 7/2006 | Kitamura |
| 2006/0224603 | A1 | 10/2006 | Correll, Jr. |
| 2007/0079081 | A1 | 4/2007 | Gladwin et al. |
| 2007/0079082 | A1 | 4/2007 | Gladwin et al. |
| 2007/0079083 | A1 | 4/2007 | Gladwin et al. |
| 2007/0088970 | A1 | 4/2007 | Buxton et al. |
| 2007/0174192 | A1 | 7/2007 | Gladwin et al. |
| 2007/0214285 | A1 | 9/2007 | Au et al. |
| 2007/0234110 | A1 | 10/2007 | Soran et al. |
| 2007/0283167 | A1 | 12/2007 | Venters, III et al. |
| 2009/0094251 | A1 | 4/2009 | Gladwin et al. |
| 2009/0094318 | A1 | 4/2009 | Gladwin et al. |
| 2010/0023524 | A1 | 1/2010 | Gladwin et al. |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

Sermersheim; Lightweight Directory Access Protocol (LDAP): The Protocol; IETF Network Working Group; RFC 1511; Jun. 2006; pp. 1-68.

Satran, et al.; Internet Small Computer Systems Interface (iSCSI); IETF Network Working Group; RFC 3720; Apr. 2004; pp. 1-257.

Xin, et al.; Evaluation of Distributed Recovery in Large-Scale Storage Systems; 13th IEEE International Symposium on High Performance Distributed Computing; Jun. 2004; pp. 172-181.

(56) References Cited

OTHER PUBLICATIONS

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

* cited by examiner

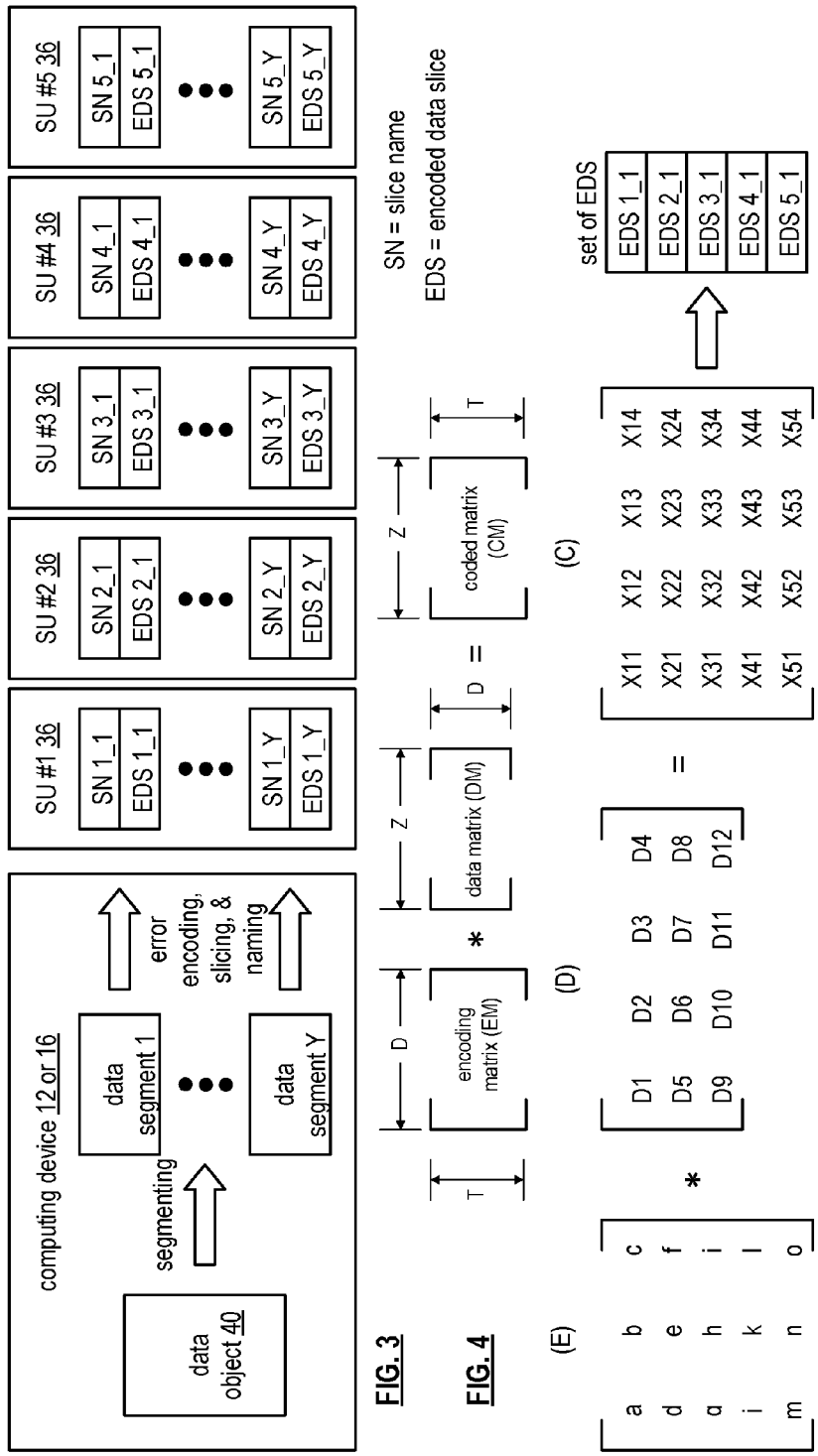

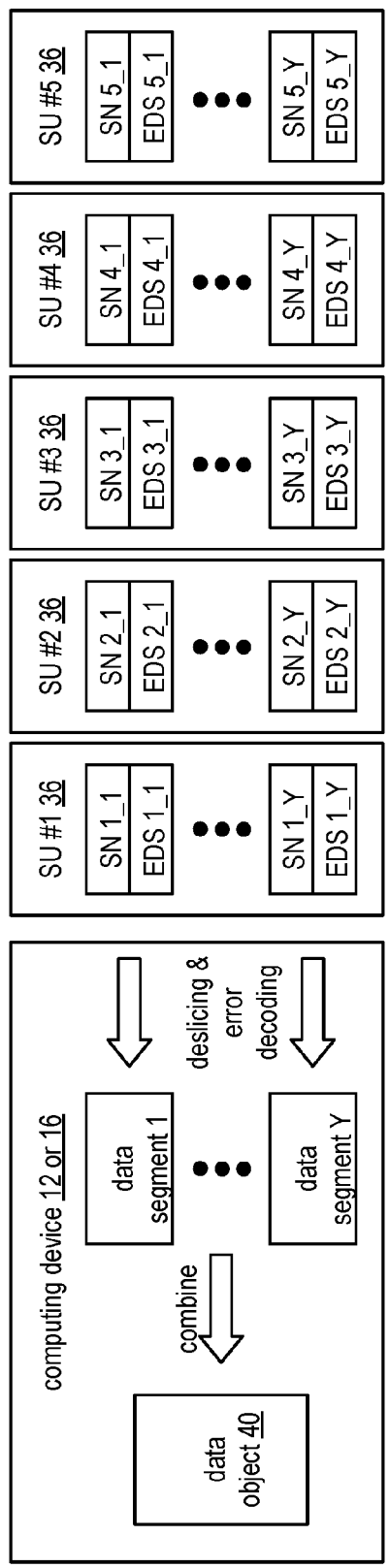

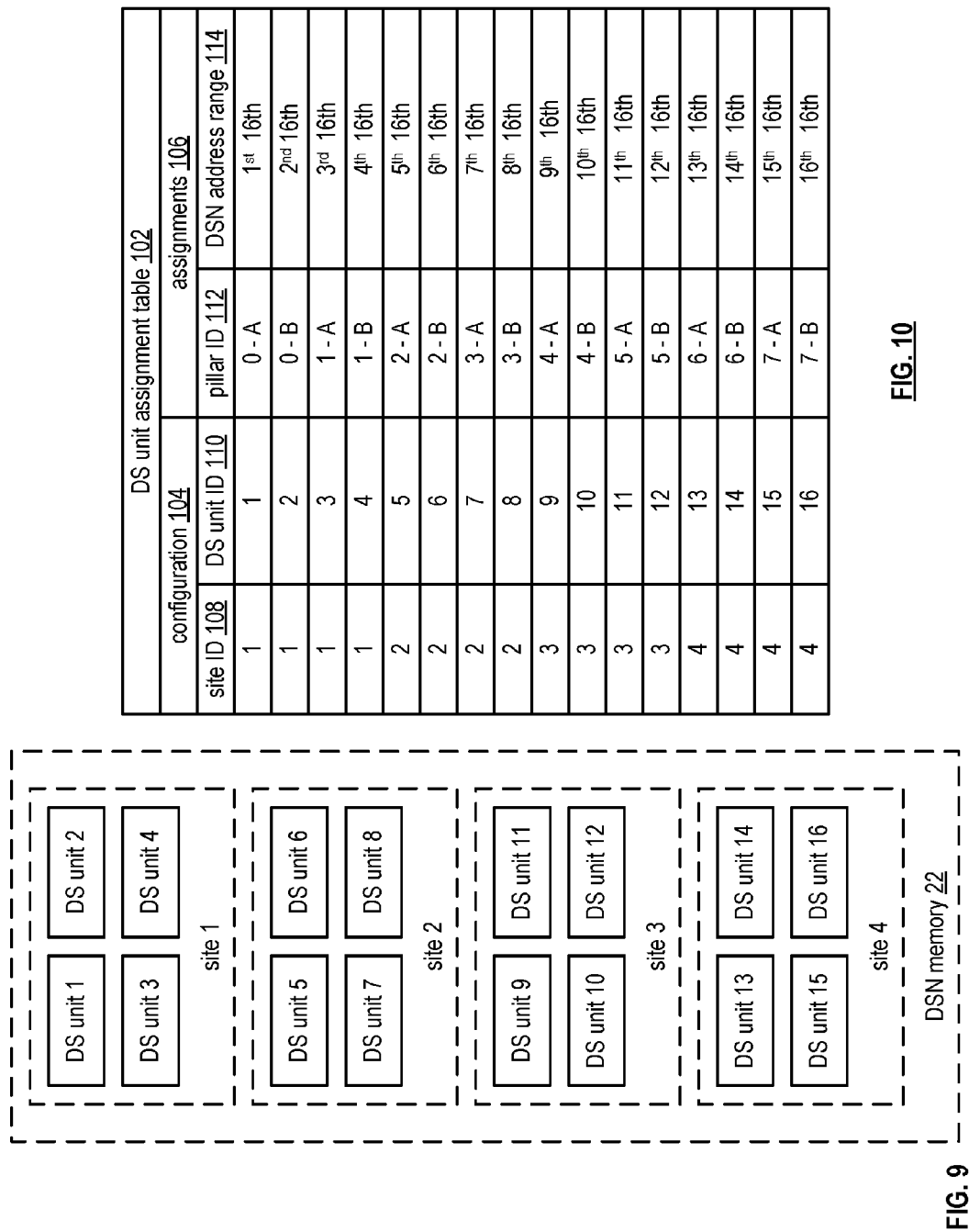

US 9,760,440 B2

SITE-BASED NAMESPACE ALLOCATION

CROSS-REFERENCE TO RELATED APPLICATIONS

The present U.S. Utility Patent Application claims priority pursuant to 35 U.S.C. §120 as a continuation-in-part of U.S. Utility application Ser. No. 14/447,909, entitled, "Distributed Rebuilding Of Data In A Dispersed Storage Network," filed Jul. 31, 2014, which is a continuation of U.S. Utility application Ser. No. 12/943,826, entitled "Data Migration in a Dispersed Storage Network," filed Nov. 10, 2010, now U.S. Pat. No. 8,954,667, which claims priority pursuant to 35 U.S.C. §119(e) to U.S. Provisional Application No. 61/299,228, entitled "Distributed Storage System Storage Method," filed Jan. 28, 2010, all of which are hereby incorporated herein by reference in their entirety and made part of the present U.S. Utility Patent Application for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

Some Internet storage systems can replicate data in different geographic locations to try and prevent data loss in the event of a catastrophic loss to the primary storage location. However, simple replication of data to multiple locations actually increases the likelihood that an unauthorized person can obtain access to that data, because now there are two separate copies of the data, each of which needs to be kept secure, because access to either copy provides access to all of the data. Furthermore, in conventional systems that store portions of data at different locations, storage allocation can be "lopsided," such that the failure of a single storage location can result in the full data set being unrecoverable.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

FIG. 7 is a schematic block diagram of an example of dispersed storage error decoding of data in accordance with the present invention;

FIG. 8 is a schematic block diagram of a generic example of an error decoding function in accordance with the present invention;

FIG. 9 is a schematic block diagram of an example embodiment of a dispersed storage network (DSN) memory in accordance with the invention;

FIG. 10 is a table illustrating an example of a dispersed storage (DS) unit assignment table in accordance with the invention.

DETAILED DESCRIPTION OF THE INVENTION

Figure 1:
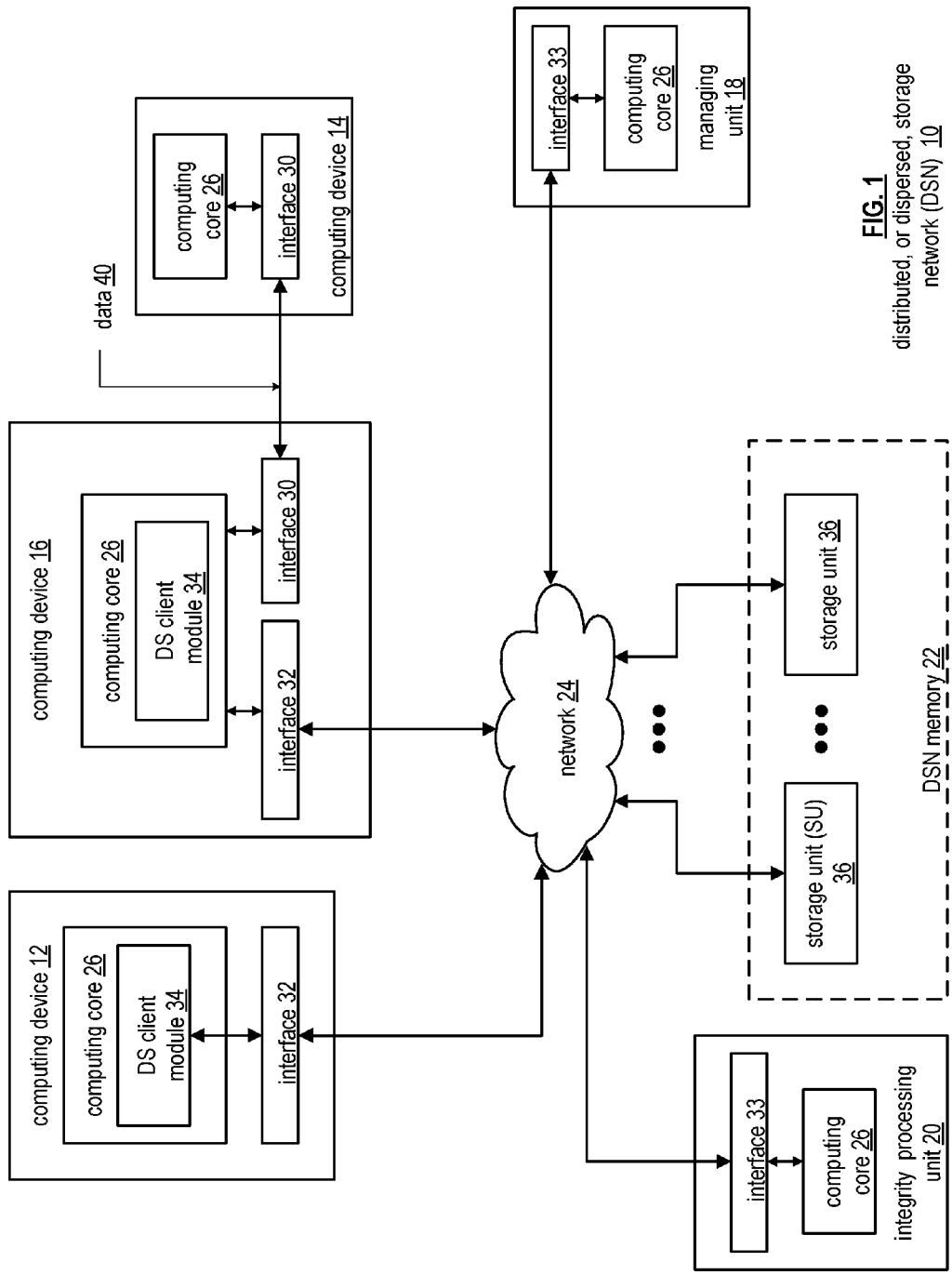
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
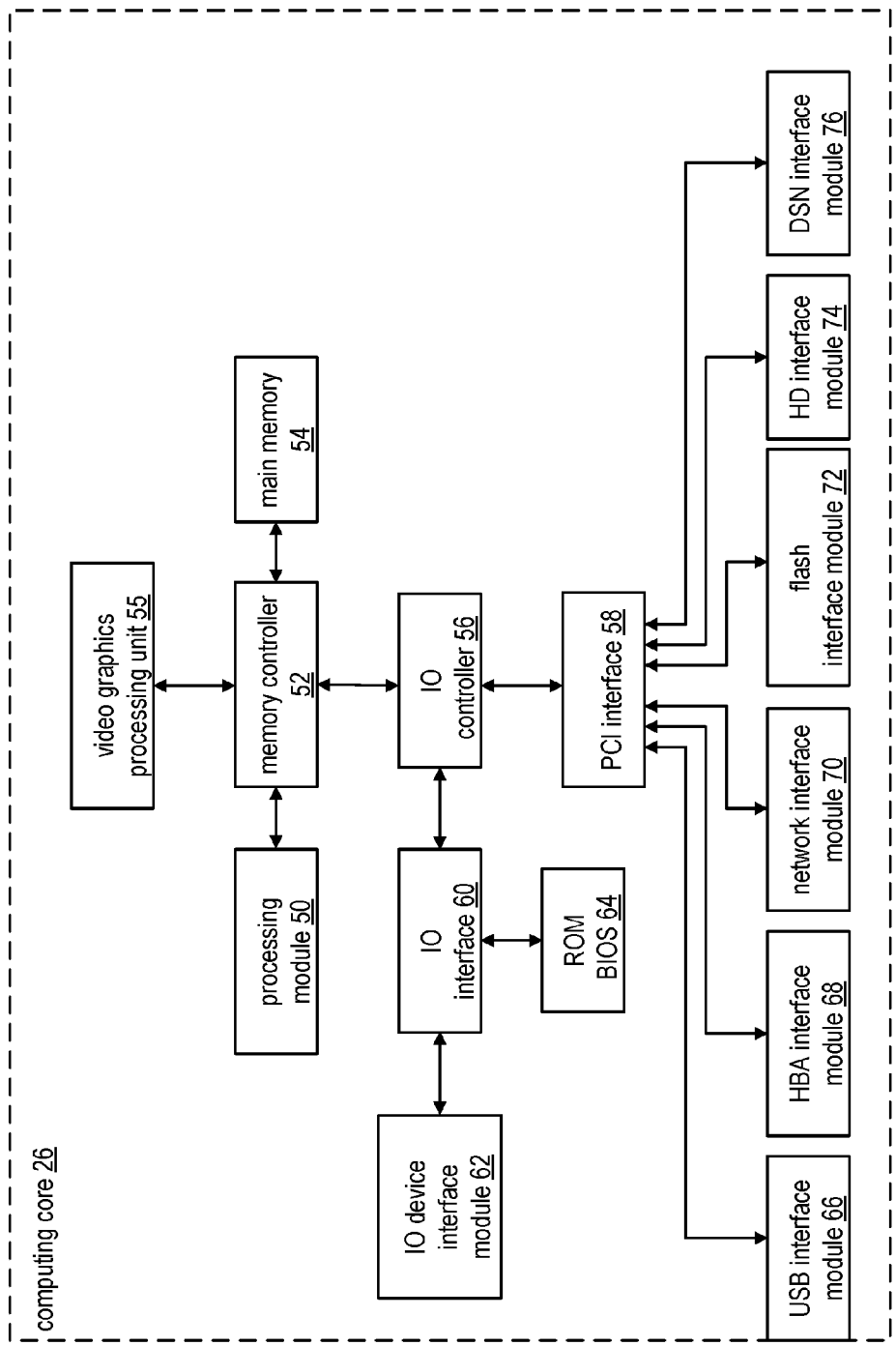
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSN managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The DSN managing unit 18 creates billing information for a particular user, a user group, a vault access, public vault access, etc. For instance, the DSN managing unit 18 tracks the number of times a user accesses a non-public vault and/or public vaults, which can be used to generate a per-access billing information. In another instance, the DSN managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DST.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

FIG. 9 is a schematic block diagram of an example embodiment of a dispersed storage network (DSN) memory 22 where a plurality of dispersed storage (DS) units comprise a DS unit storage set to facilitate the storage of each of the pillars of encoded data slices associated with one or more vaults. As illustrated, DS units 1-16 comprise the DS unit storage set where DS units 1-4 are deployed at site 1, DS units 5-8 are deployed at site 2, DS units 9-12 are deployed at site 3, and DS units 13-16 are deployed at site 4.

In a deployment example, the number of DS units is equal to or greater than the number of pillars such that the DS unit stores slices from at most one pillar. Note that this may provide an improved level of data reliability since an outage of one DS unit may only impact the slice availability for one pillar. For instance, DS units 1-16 comprise the DS unit storage set and may support a vault with a pillar width of 16 and a read threshold of 10 (e.g., a 16/10 system). In another instance, the DS unit storage set may support a vault with a pillar width of 8 and a read threshold of 5 (e.g., an 8/5 system). In another instance, the DS unit storage set may support a vault with a pillar width of 4 and a read threshold of 3 (e.g., a 4/3 system). In another deployment example, the number of pillars may be greater than the number of DS units such that at least one DS unit stores slices of two or more pillars. For instance, the DS unit storage set may support a vault with a pillar width of 32 and a read threshold of 24 (e.g., a 32/24 system) where each DS unit stores slices of two pillars.

The DS units may be affiliated with different sites or locations. The utilization of different sites may provide improved system reliability where data objects can be re-created from slices retrieved from available sites when at least one site is unavailable. Note that slices are retrieved from a read threshold number of pillars to re-create the data object. Further note that the assignment of DS units-to-pillars may impact the ability to retrieve slices of a read threshold number of pillars when DS units and/or sites are unavailable. For example, a data object may not be recoverable due to a site outage in an 8/5 system when each of four DS units at a first site may each be assigned to one pillar and four more DS units at a second site may each be assigned to one pillar. In another example, a data object may still be recoverable with one site outage in an 8/5 system when each of four DS units at four sites may be assigned to half of a pillar (e.g., two pillars per site) since a site outage still leaves six available pillars.

A DS managing unit may determine DS unit pillar assignments to affect system reliability based on one or more of the number of sites, the number of DS units, operational parameters (e.g., pillar width, read threshold), and/or the information dispersal algorithm information (e.g., slice encoding method). For example, a processing module of the DS managing unit determines to assign each of the DS units 1-16 to one pillar when the pillar width is 16 and the read threshold is 10. Note that data objects are recoverable when a maximum of one site is unavailable or when a maximum of six DS units are unavailable and all of the sites are available.

In another example, the processing module determines to assign a pair of DS units per pillar when the pillar width is 8 and the read threshold is 5 (e.g., an 8/5 system). For instance, processing module assigns a first DS unit (e.g., unit A) of the DS unit pair to a first portion of an address range of the slice names that may be stored in the affiliated vault and the processing module assigns a second DS unit (e.g., unit B) of the DS unit pair to a second portion of the address range of the slice names that may be stored in the affiliated vault. Note that data objects are recoverable when a maximum of one site is unavailable or when five DS units are available (e.g., all "A" units or all "B" units) that contain the five pillars of the data object. Further note that in an extreme example this implies that as many as 11 DS units may be unavailable (e.g., all 8 B's and 3 A's) and some of the data (e.g., stored in the A's) may be recoverable. Further note that in another extreme example this implies that as few as four unavailable DS units (e.g., 4 A's) may prevent the recovery of some data objects (e.g., stored to the A's). The method to assign DS units to pillars is discussed in greater detail with reference to FIGS. 10 and 11.

FIG. 10 is a table illustrating an example of a dispersed storage (DS) unit assignment table. Such a table may be utilized by a processing module of a DS managing unit to assign DS units to the pillars of a vault to favorably impact the minimization of unavailable data objects based in part on configuration information. As illustrated, the DS unit assignment table 102 includes a configuration field 104 and an assignments field 106. The configuration field 104 may contain configuration information received from one or more of a user device, a DS processing unit, a storage integrity processing unit, a DS managing unit, and a DS unit. The configuration information may include one or more of a site identifier (ID), a list of site IDs, a DS unit ID, a list of DS unit IDs, a DS unit ID to site ID deployment list, and operational parameters. As illustrated, the configuration field 104 includes a site ID field 108 and a DS unit ID field 110. In an example, the configuration information that includes the deployment of DS units 1-16 to sites 1-4 is received from a DS managing unit input.

As illustrated, the assignments field 106 of the DS unit assignment table 102 includes a pillar ID field 112 and a dispersed storage network (DSN) address range 114. The pillar ID field 112 may indicate a pillar ID to DS unit assignment. The DSN address range field 114 may indicate a DSN address range (e.g., slice name range) to DS unit assignment. In an example, a processing module of a DS managing unit determines the content of the assignments field 106 of the DS unit assignment table 102 based on one or more of configuration information, a DS unit assignment policy, a reliability goal, DS unit availability history, estimated DS unit storage set utilization, site location information, site availability history, environmental factors, a pre-determination, a command, and a message.

As illustrated, the processing module assigns pillar 0-A to DS unit 1, pillar 0-B to DS unit 2, pillar 1-A to DS unit 3, pillar 1-B to DS unit 4 for site 1, 2-A to DS unit 5, pillar 2-B to DS unit 6, pillar 3-A to DS unit 7, pillar 3-B to DS unit 8 for site 2, 4-A to DS unit 9, pillar 4-B to DS unit 10, pillar 5-A to DS unit 11, pillar 5-B to DS unit 12 for site 3, 6-A to DS unit 13, pillar 6-B to DS unit 14, pillar 7-A to DS unit 15, pillar 7-B to DS unit 16 for site 4 when the configuration information includes four sites, sixteen DS units, and operational parameters with a pillar width of 8 and a read threshold of 5.

As illustrated, the processing module assigns 1/16 of the configured DS unit address range to each of the sixteen DS units. In an embodiment, a DS processing unit may access the DS unit storage set in the lower part of a pillar address range by accessing the DS units assigned to the A ranges and the DS processing unit may access the DS unit storage set in the upper part of a pillar address range by accessing the DS units assigned to the B Ranges.

Figure 11:
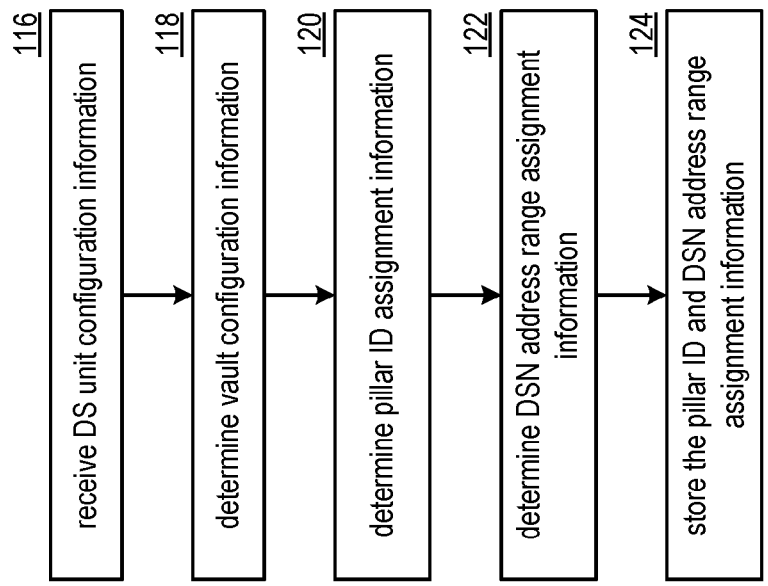
FIG. 11 is a flowchart illustrating an example of determining dispersed storage (DS) unit assignment information in accordance with the invention.

FIG. 11 is a flowchart illustrating an example of determining dispersed storage (DS) unit assignment information. The method begins with step 116 where a processing module (e.g., of a DS managing unit) receives DS unit configuration information. The configuration information may be received from one or more of a user device, a DS processing unit, a storage integrity processing unit, a DS managing unit, and a DS unit. The configuration information may include one or more of a vault identifier (ID), a number of DS units assigned to the vault ID, site locations of the DS units, a site ID, a list of site IDs, a DS unit ID, a list of DS unit IDs, a DS unit ID to site ID deployment list, and operational parameters.

The method continues at step 118 where the processing module determines vault configuration information. The vault configuration information may include one or more of the DS unit configuration information, a DS unit assignment policy, a pillar width, a read threshold, a write threshold, a generation number, a dispersed storage network (DSN) address range, encoding method, an encryption method, and any other operational parameters elements. Such a determination may be based on one or more of a vault ID, a DS managing unit message, a vault lookup, a DSN memory performance indicator, a command, a predetermination, and the DS unit configuration information.

The method continues at step 120 where the processing module determines pillar ID assignment information. Such a determination may be based on one or more of the DS unit configuration information, vault configuration information, a vault ID, a vault lookup, a DS unit assignment policy, a reliability goal, DS unit availability history, a DSN memory performance indicator, estimated DS unit storage set utilization, site location information, site availability history, environmental factors, a predetermination, a command, and message. For example, the processing module determines the pillar ID assignment information as illustrated in FIG. 10 when there are four sites, 16 DS units, and the pillar width is 8. Note that data objects may still be reproduced based on retrieving slices from DS units when one at most one site of DS units is unavailable.

The method continues at step 122 where the processing module determines DSN address range assignment information. The DSN address range assignment information may include a mapping of DS units to portions of the DSN address range assigned to the vault in accordance with a DS unit assignment policy. Such a determination may be based on one or more of the pillar ID assignment information, the DS unit configuration information, the vault configuration information, a DSN address range vault assignment, the vault ID a DS managing unit message, a vault lookup, a DSN memory performance indicator, a command, and a predetermination. For example, the processing module determines the DSN address range assignment information as illustrated in FIG. 10 in accordance with the pillar ID assignment information where each pillar is assigned to 1/16 of the DSN address range vault assignment.

The method continues at step 124 where the processing module stores the pillar ID assignment information and the DSN address range assignment information in a DSN memory, and a vault, and in the DSN address to physical location table to facilitate subsequent access of the newly assigned DS unit storage set. In an instance, the information is stored as encoded data slices. In another instance, the information is stored as a data object.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A processing system configured to implement a distributed storage (DS) managing unit, the DS managing unit comprising:
    a computing core including associated memory;
    a network interface configured to couple the DS managing unit to a dispersed storage network (DSN) memory including a plurality of physical sites at which one or more DS units are located, the DS units storing encoded data slices associated with a storage vault having a number of pillars and a read threshold, the number of pillars corresponding to a first number of encoded data slices generated from a particular segment of data of a plurality of data segments of a data object, and the read threshold corresponding to a second number of encoded data slices, fewer than the first number of encoded data slices, the second number of encoded data slices corresponding to a subset of the first number of encoded data slices required to reconstruct the particular segment of data; and
    the computing core configured to assign storage of a particular encoded data slice to a particular DS unit included in the DSN memory based, at least in part, on a pillar associated with the particular encoded data slice, and on a physical site at which the particular DS unit is located such that at least one of the physical sites is assigned storage of encoded data slices associated with a plurality of pillars, and such that no one physical site is assigned storage of at least the read threshold number of the encoded data slices generated from the particular segment of data.

2. The processing system of claim 1, wherein the DSN memory includes a number of DS units greater than or equal to the number of pillars associated with the storage vault.

3. The processing system of claim 1, wherein the DSN memory includes fewer DS units than the number of pillars associated with the storage vault.

4. The processing system of claim 1, wherein the computing core assigns a pair of DS units per pillar.

5. The processing system of claim 1, wherein the computing core assigns storage of the particular encoded data slice based on a DS unit assignment table including a configuration field populated based, at least in part on information obtained from the DSN memory.

6. The processing system of claim 1, wherein the computing core assigns storage of the particular encoded data slice based on a DS unit assignment table associating a range of DSN slice names with a particular DS unit.

7. The processing system of claim 1, wherein the computing core is further configured to:
assign storage of the particular encoded data slice to the particular DS unit based, at least in part, on a history of availability of the physical site at which the particular DS unit is located.

8. A method for use in a dispersed storage network (DSN) including a DSN memory, the method comprising:
receiving distributed storage (DS) unit configuration information associated with a plurality of distributed storage (DS) units included in the DSN memory, the DS unit configuration information including information associated with sites at which the plurality of DS units are physically located;
determining vault configuration information associated with a vault, the vault configuration information including information associated with a pillar width and a read threshold associated with the vault; and
assigning a range of encoded data slices to be stored in particular DS units of the plurality of DS units based, at least in part, on the vault configuration information and the DS unit configuration information such that no one of the sites is assigned encoded data slices corresponding to a read threshold or greater number of pillars of the pillar width.

9. The method of claim 8, wherein the assigning further comprises:
determining pillar identification (ID) assignment information for the vault based, at least in part, on a reliability goal.

10. The method of claim 8, wherein the assigning further comprises:
determining DSN address range assignment information.

11. The method of claim 10, wherein determining the DSN address range assignment information further comprises:
mapping the particular DS units to particular portions of an address range associated with the vault based, at least in part, on a performance indicator associated with the DSN memory.

12. The method of claim 10, further comprising:
storing the DSN address range assignment information in a table associating a DSN address range with a physical location.

13. The method of claim 8, wherein the DSN memory includes a number of DS units greater than or equal to the pillar width associated with the vault.

14. The method of claim 8, wherein the DSN memory includes fewer DS units than the pillar width associated with the vault.

15. A dispersed storage network (DSN) comprising:
a DSN memory including a plurality of physical sites at which one or more DS units are located, the DS units storing encoded data slices associated with a storage vault having a number of pillars and a read threshold, the number of pillars corresponding to a first number of encoded data slices generated from a particular segment of data of a plurality of data segments of a data object, and the read threshold corresponding to a second number of encoded data slices, fewer than the first number of encoded data slices, the second number of encoded data slices corresponding to a subset of the first number of encoded data slices required to reconstruct the particular segment of data; and
at least one computing core implementing a managing unit configured to assign storage of a particular encoded data slice to a particular DS unit included in the DSN memory based, at least in part, on a pillar associated with the particular encoded data slice, and on a physical site at which the particular DS unit is located such that no one physical site of the plurality of physical sites is assigned storage of at least the read threshold number of the encoded data slices generated from the particular segment of data.

16. The dispersed storage network (DSN) of claim 15, wherein the DSN memory includes a number of DS units greater than or equal to the number of pillars associated with the storage vault.

17. The dispersed storage network (DSN) of claim 15, wherein the managing unit assigns a pair of DS units per pillar.

18. The dispersed storage network (DSN) of claim 15, wherein the managing unit assigns storage of the particular encoded data slice based on a DS unit assignment table including a configuration field and an assignments field.

19. The dispersed storage network (DSN) of claim 15, wherein the managing unit assigns storage of the particular encoded data slice based on a DS unit assignment table associating a range of DSN slice names with a particular DS unit.

20. The dispersed storage network (DSN) of claim 15, wherein the managing unit is further configured to:
assign storage of the particular encoded data slice to the particular DS unit based, at least in part, on a history of availability of one or more DS units included in the DSN memory.

* * * * *